US011503733B1

(12) United States Patent
Oh et al.

(10) Patent No.: US 11,503,733 B1
(45) Date of Patent: Nov. 15, 2022

(54) REWORKABLE BORDERLESS DISPLAY WITH MAGNETIC GLUE AND FOAM TAPE

(71) Applicant: DELL PRODUCTS, LP, Round Rock, TX (US)

(72) Inventors: Guantaek Oh, Hillview (SG); KyungEun Lee, Bukit Batok (SG)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/363,562

(22) Filed: Jun. 30, 2021

(51) Int. Cl.
*H05K 7/14* (2006.01)
*G02F 1/1333* (2006.01)

(52) U.S. Cl.
CPC ..... *H05K 7/1417* (2013.01); *G02F 1/133314* (2021.01); *G02F 1/133317* (2021.01); *G02F 2202/28* (2013.01)

(58) Field of Classification Search
None
See application file for complete search history.

(56) References Cited

U.S. PATENT DOCUMENTS

| 8,587,745 | B2 | 11/2013 | Wu et al. |
| 10,656,463 | B2* | 5/2020 | Takeuchi ......... G02F 1/133603 |
| 2014/0184983 | A1* | 7/2014 | Wu ................ G02F 1/133308 |
| | | | 349/61 |

FOREIGN PATENT DOCUMENTS

EP   2725410 A1   4/2014

* cited by examiner

*Primary Examiner* — Richard H Kim
(74) *Attorney, Agent, or Firm* — Larson Newman, LLP

(57) ABSTRACT

A display device includes a display panel device and a frame configured to hold the display panel device. The display panel device includes a first magnetic adherent. The frame includes a second adherent. The display panel device is adhered to the frame via the first adherent and the second adherent, such that the display panel device is removable from the frame for rework without damaging the first adherent and the second adherent.

17 Claims, 3 Drawing Sheets

200

REWORKABLE BORDERLESS DISPLAY WITH MAGNETIC GLUE AND FOAM TAPE

FIELD OF THE DISCLOSURE

This disclosure generally relates to information handling systems, and more particularly relates to providing a reworkable borderless display device.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A display device may include a display panel device and a frame configured to hold the display panel device. The display panel device may include a first magnetic adherent. The frame may include a second adherent. The display panel device may be adhered to the frame via the first adherent and the second adherent, such that the display panel device is removable from the frame for rework without damaging the first adherent and the second adherent.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
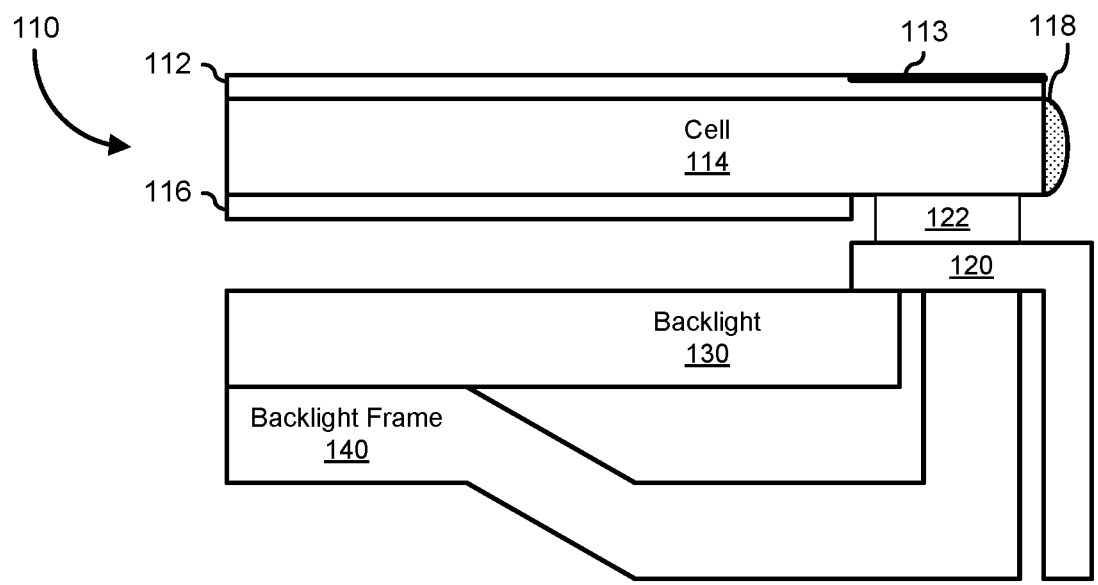
FIG. 1 is a cut-away diagram of a display device according to the prior art.

FIG. 1 illustrates a portion of a display device 100, as may be known in the prior art. Display device 100 represents a device for projecting visual information, and may include a computer monitor, an outdoor display device, a laptop or tablet display screen, a cellular phone device display screen, or other display device, as needed or desired. Note that, as illustrated, display device 100 is represented as a Liquid Crystal Display (LCD) display device, but this is not necessarily so. In particular, display device 100 may also represent a Light Emitting Diode (LED) display device such as an Organic LED (OLED) display device, a Plasma Display Panel (PDP) display device, a Quantum Dot LED (QLED) display device, or the like.

Display device 100 includes a display panel assembly 110, a panel subframe 120, a backlight assembly 130, and a backlight frame 140. Display panel assembly 110 represents a Liquid Crystal Display (LCD) device and includes a top polarizer film 112, a display panel device 114, a bottom polarizer film 116, and a side seal 118. Top polarizer film 112 includes a printed portion 113 on a bottom surface, that is, on a surface adjacent to display panel device 114. Printed portion 113 is a darkened portion of top polarizer film 112 that provides a distinct edge for display panel assembly 110. Display panel assembly 110 may be provided by a display manufacturer as an assembled unit, or display panel device 114 and polarizer films 112 and 116 may be provided separately, and assembled into the display panel assembly by a manufacturer of display device 100, as needed or desired. The details of display panel assembly 100, both in terms of its manufacture and use in projecting visual information are known in the art, and will not be further described herein, except as needed to illustrate the current embodiments. Display panel assembly 110 is affixed to panel subframe 120 by a strip of double-sided tape 122 around the perimeter of the display panel assembly, and that adheres the bottom edge of the display panel assembly to the panel subframe. Backlight assembly 130 provides the light source for display panel assembly 110, and is affixed to backlight frame 140, and may further provide a mounting assembly for affixing panel subframe 120 to the backlight frame.

Display device 100 may include a display frame, not illustrated, that provides a rigid mounting structure for the assemblage of display panel assembly 110, panel subframe 120, and backlight assembly 130 which may be fastened to the backlight frame by a number of fasteners. Display device 100 may further include cover glass, not illustrated, that provides a tough outer protective surface for the display device, and may be composed of a structural glass, a polymer, or the like, as needed or desired. Side seal 118 is provided around the perimeter of display panel device 114 to narrow the gap between display panel device 114 and the display frame, to mitigate the entry of foreign particles behind display panel assembly 110, and to eliminate light leakage out of the end of the display panel device. Display device 100 may include a back cover, not illustrated, into which the complete assemblage of display panel assembly 110, panel subframe 120, backlight assembly 130, and backlight frame 140, the display frame, and the cover glass are installed, as needed or desired.

In the typical display device, the double-sided tape that adheres the bottom edge of the display panel assembly to the panel subframe needs to be wide enough or sticky enough to securely fasten the display panel so that peel-off of the display panel does not occur. In particular, higher levels of adhesion of the display panel assembly to the panel subframe leads to safer and more reliable display devices. However, with higher levels of adhesion, the difficulty reworking the display device increases and the safety of the rework process decreases. This is because the separation of a display panel assembly from a panel subframe typically involves the cutting of the double-sided tape, and the double-sided tape is destroyed in the process. In particular, higher levels of adhesion means the force needed to pry the display panel assembly from the panel subframe is greater, leading to greater possibility of injury or damage to the display device, and increasing the cost of the rework process. Moreover, in the rework process, the remains of the double-sided tape needs to be meticulously removed from the panel subframe before a new display panel assembly can be attached to the panel subframe. It has been determined by the inventors of the current disclosure, that an amount of adhesion between a display panel assembly and a panel subframe of 40 grams per square millimeter ($g/m^2$) provides for easy rework, but may not achieve sufficient safety margin and reliability, while an amount of adhesion of 120 $g/m^2$ provides for sufficient safety and reliability while unduly increasing the cost and complexity of rework. As such, the inventors of the current disclosure have determined that an amount of adhesion of 60 $g/m^2$ provides an optimum balance between safety and reliability on the one hand and the cost and complexity of rework on the other hand. Generally, amounts of adhesion in the range of 48-80 $g/m^2$ may be determined to provide adequate safety and reliability coupled with acceptable cost and complexity of rework.

Figure 2:
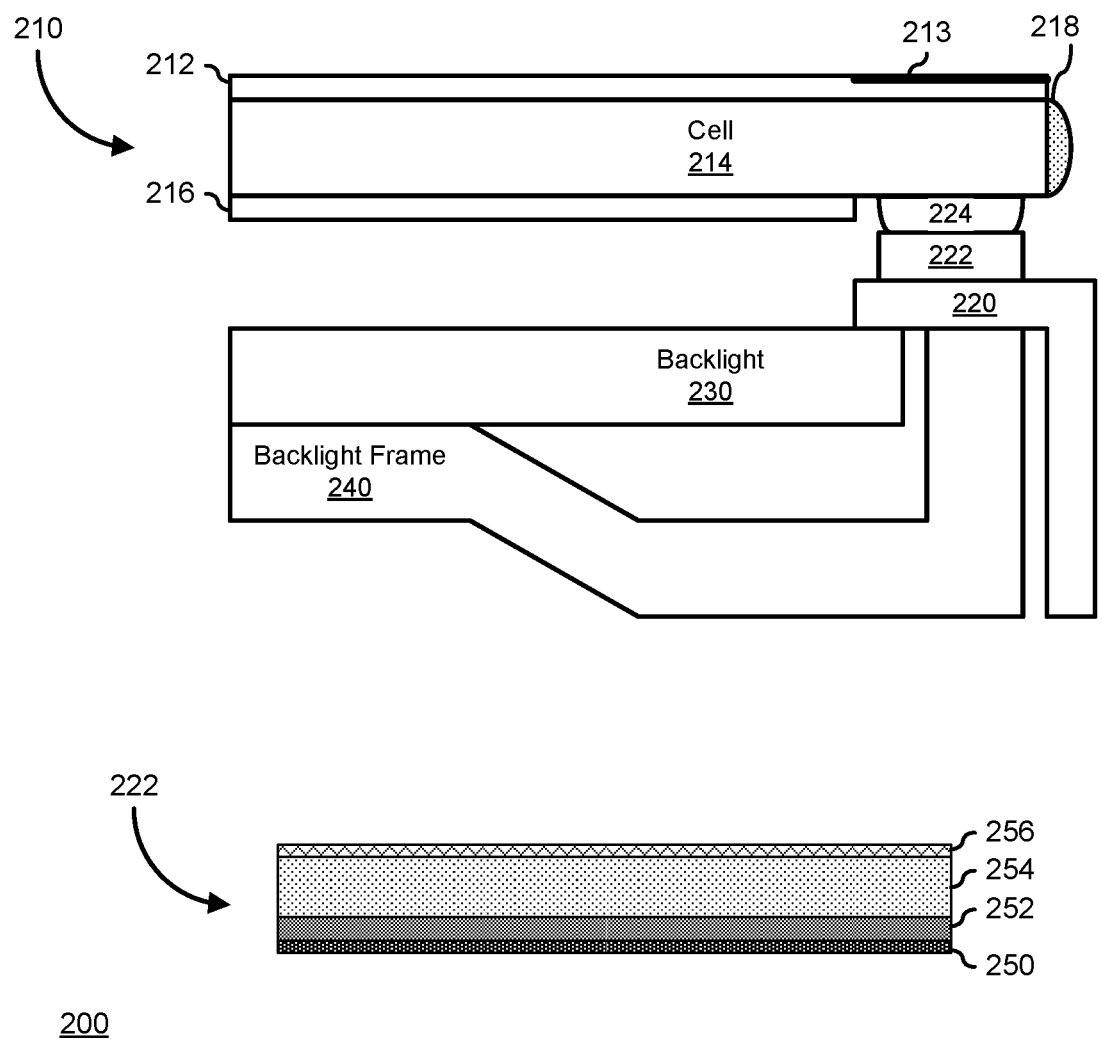
FIG. 2 is a cut-away diagram of a display device according to an embodiment of the current disclosure.

FIG. 2 illustrates a portion of a display device 200, according to an embodiment of the current disclosure. Display device 200 is similar to display device 100, representing a device for projecting visual information, and may include a computer monitor, an outdoor display device, a laptop or tablet display screen, a cellular phone device display screen, or other display device, as needed or desired. Display device 200 may represent a LCD display device, a LED display device, a PDP display device, a QLED display device, or the like, and the teachings of the present disclosure will be understood by the skilled artisan to be broadly adaptable to various display device technologies, as needed or desired.

Display device 200 includes a display panel assembly 210, a panel subframe 220, a backlight assembly 230, and a backlight frame 240. Display panel assembly 210 is similar to display panel assembly 110, and includes a top polarizer film 212, a display panel device 214, and a bottom polarizer film 216. Top polarizer film 212 includes a printed portion 213 on a bottom surface, that is, on a surface adjacent to display panel device 214. Display panel assembly 210 may be provided by a display manufacturer as an assembled unit, or display panel device 214 and polarizer films 212 and 216 may be provided separately, and assembled into the display panel assembly by a manufacturer of display device 200, as needed or desired. The details of display panel assembly 200 are known in the art, and will not be further described herein, except as needed to illustrate the current embodiments.

Display panel assembly 210 is affixed to panel subframe 220 by a strip of single-sided magnetic tape 222 affixed to the panel subframe, and a bead of magnetic glue 224 applied to the display panel assembly. Magnetic tape 222 is illustrated in greater detail as including an adhesive layer 250, a blackened film layer 252, a foam layer 254, and a magnetic adhesion layer 256. The layers 250-256 are bonded together to provide a tape that can be cut to fit lengths of the sides of display panel assembly 210. The lengths of magnetic tape 222 are adhered to panel subframe 220 via adhesive layer 250, leaving magnetic adhesion layer 256 exposed toward display panel assembly 210. Magnetic glue 224 is applied to the bottom side of display panel assembly 210 in a line that substantially matches the location of magnetic tape 222 on panel subframe 220. Magnetic glue 224 is permitted to dry or cured before display panel assembly 120 is assembled to display device 200. For example, magnetic glue 224 may represent a water based magnetic glue that is air dried with or without heat treatment, may represent a magnetic glue that is cured by exposer to ultraviolet (UV) light or other radiation, or the like. Then, upon assembly of display device 200, magnetic tape 222 and magnetic glue 224 form a magnetic attraction that provides an amount of adhesion between display panel assembly 210 and panel subframe 220, thereby holding the display panel assembly into the display panel. In another embodiment, not illustrated, magnetic tape is applied to a display panel assembly, and magnetic glue is applied to a panel subframe.

Magnetic tape 222 and magnetic glue 224 are selected such that a desired amount of adhesion is provided between display panel assembly 210 and panel subframe 220. For example, magnetic tape 222 and magnetic glue 224 may be selected to provide an amount of adhesion in a range of 48-80 $g/m^2$. In a particular embodiment, magnetic tape 222 and magnetic glue 224 are selected to provide an amount of adhesion of 60 $g/m^2$. While the illustrated embodiment shows a combined depth of magnetic tape 222 and magnetic glue 224 to be greater than the depth of the associated double-sided tape 122, it will be understood that the combined depth of magnetic tape 22 and magnetic glue 224 can be selected such that the combined depth is substantially equal to the depth of the double-sided tape, as needed or desired. Here, the magnetic attraction between magnetic tape 222 and magnetic glue 224 will be understood to provide the desired amount of adhesion to create a safe and reliable display panel. Here, rework is simplified because the separation of display panel assembly 210 and panel subframe 220 involves only overcoming the magnetic attraction, and does not require the destruction of either magnetic tape 222 or magnetic glue 224, and reassembly can be performed by simply reattaching a display panel assembly to the magnetic tape. Moreover, because the rework is simplified, greater levels of adhesion, such as 80 $g/m^2$, may be utilized to increase the safety and reliability of display device 200 without unduly increasing the cost or complexity of the rework process.

Display device 200 may include a display frame, not illustrated, that provides a rigid mounting structure for the assemblage of display panel assembly 210, panel subframe 220, and backlight assembly 230 which may be fastened to the backlight frame by a number of fasteners. Display device 200 may further include cover glass, not illustrated, that provides a tough outer protective surface for the display device, and may be composed of a structural glass, a polymer, or the like, as needed or desired. Display device 200 may include a back cover, not illustrated, into which the complete assemblage of display panel assembly 210, panel subframe 220, backlight assembly 230, backlight frame 240, the display frame, and the cover glass are installed, as needed or desired. In a particular embodiment, the cover glass is attached to display device 200 utilizing magnetic tape similar to magnetic tape 222 and magnetic glue similar to magnetic glue 224, as needed or desired. As illustrated, both the magnetic tape and the magnetic glue are include magnetic layers or materials, but this is not necessarily so. In particular, it may be understood that one of the magnetic tape and the magnetic glue may not include magnetic materials or materials, but may instead include magnetizable ferromagnetic materials, such as iron, cobalt, nickel, or the like. For example, a magnetic tape similar to magnetic tape 222 may be used in combination with a glue or adhesive that includes magnetizable ferromagnetic materials, such as iron, cobalt, nickel or other magnetizable materials that are attracted to the magnetic layer of the magnetic tape, but that are not themselves magnetized. Similarly, a magnetic glue similar to magnetic glue 224 may be used in combination with a single-sided tape that has a metallic layer that is attracted to the magnetic glue. Note further that the term "glue" is meant to be interpreted broadly, and other types of adhesives, such as silicon adhesives, epoxy adhesives, or the like, that include magnetic materials or magnetizable materials, may be utilized as needed or desired.

Figure 3:
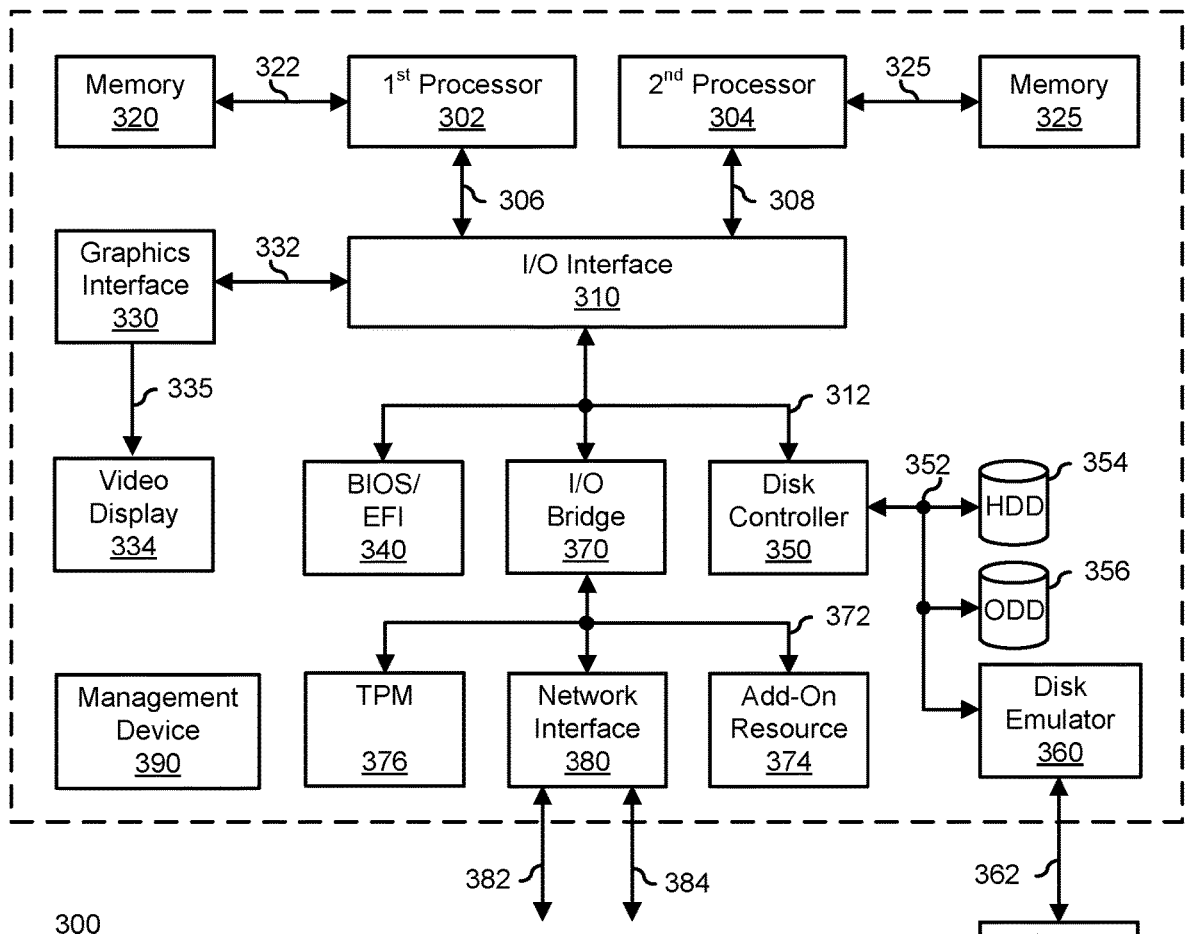
FIG. 3 is a block diagram illustrating a generalized information handling system according to another embodiment of the present disclosure.

FIG. 3 illustrates a generalized embodiment of an information handling system 300. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 300 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 300 can include processing resources for executing machine-executable code, such as a central processing unit (CPU), a programmable logic array (PLA), an embedded device such as a System-on-a-Chip (SoC), or other control logic hardware. Information handling system 300 can also include one or more computer-readable medium for storing machine-executable code, such as software or data. Additional components of information handling system 300 can include one or more storage devices that can store machine-executable code, one or more communications ports for communicating with external devices, and various input and output (I/O) devices, such as a keyboard, a mouse, and a video display. Information handling system 300 can also include one or more buses operable to transmit information between the various hardware components.

Information handling system 300 can include devices or modules that embody one or more of the devices or modules described below, and operates to perform one or more of the methods described below. Information handling system 300 includes a processors 302 and 304, an input/output (I/O) interface 310, memories 320 and 325, a graphics interface 330, a basic input and output system/universal extensible firmware interface (BIOS/UEFI) module 340, a disk controller 350, a hard disk drive (HDD) 354, an optical disk drive (ODD) 356, a disk emulator 360 connected to an external solid state drive (SSD) 362, an I/O bridge 370, one or more add-on resources 374, a trusted platform module (TPM) 376, a network interface 380, a management device 390, and a power supply 395. Processors 302 and 304, I/O interface 310, memory 320, graphics interface 330, BIOS/UEFI module 340, disk controller 350, HDD 354, ODD 356, disk emulator 360, SSD 362, I/O bridge 370, add-on resources 374, TPM 376, and network interface 380 operate together to provide a host environment of information handling system 300 that operates to provide the data processing functionality of the information handling system. The host environment operates to execute machine-executable code, including platform BIOS/UEFI code, device firmware, operating system code, applications, programs, and the like, to perform the data processing tasks associated with information handling system 300.

In the host environment, processor 302 is connected to I/O interface 310 via processor interface 306, and processor 304 is connected to the I/O interface via processor interface 308. Memory 320 is connected to processor 302 via a memory interface 322. Memory 325 is connected to processor 304 via a memory interface 327. Graphics interface 330 is connected to I/O interface 310 via a graphics interface 332, and provides a video display output 336 to a video display 334. In a particular embodiment, information handling system 300 includes separate memories that are dedicated to each of processors 302 and 304 via separate memory interfaces. An example of memories 320 and 330 include random access memory (RAM) such as static RAM (SRAM), dynamic RAM (DRAM), non-volatile RAM (NV-RAM), or the like, read only memory (ROM), another type of memory, or a combination thereof. BIOS/UEFI module 340, disk controller 350, and I/O bridge 370 are connected to I/O interface 310 via an I/O channel 312. An example of I/O channel 312 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 310 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 340 includes BIOS/UEFI code operable to detect resources within information handling system 300, to provide drivers for the resources, initialize the resources, and access the resources. BIOS/UEFI module 340 includes code that operates to detect resources within information handling system 300, to provide drivers for the resources, to initialize the resources, and to access the resources.

Disk controller 350 includes a disk interface 352 that connects the disk controller to HDD 354, to ODD 356, and to disk emulator 360. An example of disk interface 352 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 360 permits SSD 364 to be connected to information handling system 300 via an external interface 362. An example of external interface 362 includes a USB interface, an IEEE 1394 (Firewire) interface, a proprietary interface, or a combination thereof. Alternatively, solid-state drive 364 can be disposed within information handling system 300.

I/O bridge 370 includes a peripheral interface 372 that connects the I/O bridge to add-on resource 374, to TPM 376, and to network interface 380. Peripheral interface 372 can be the same type of interface as I/O channel 312, or can be a different type of interface. As such, I/O bridge 370 extends the capacity of I/O channel 312 when peripheral interface 372 and the I/O channel are of the same type, and the I/O bridge translates information from a format suitable to the I/O channel to a format suitable to the peripheral channel 372 when they are of a different type. Add-on resource 374 can include a data storage system, an additional graphics interface, a network interface card (NIC), a sound/video processing card, another add-on resource, or a combination thereof. Add-on resource 374 can be on a main circuit board, on separate circuit board or add-in card disposed within information handling system 300, a device that is external to the information handling system, or a combination thereof.

Network interface 380 represents a NIC disposed within information handling system 300, on a main circuit board of the information handling system, integrated onto another component such as I/O interface 310, in another suitable location, or a combination thereof. Network interface device 380 includes network channels 382 and 384 that provide interfaces to devices that are external to information handling system 300. In a particular embodiment, network channels 382 and 384 are of a different type than peripheral channel 372 and network interface 380 translates information from a format suitable to the peripheral channel to a format suitable to external devices. An example of network channels 382 and 384 includes InfiniBand channels, Fibre Channel channels, Gigabit Ethernet channels, proprietary channel architectures, or a combination thereof. Network channels 382 and 384 can be connected to external network resources (not illustrated). The network resource can include another information handling system, a data storage system, another network, a grid management system, another suitable resource, or a combination thereof.

Management device 390 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 300. In particular, management device 390 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 300, such as system cooling fans and power supplies. Management device 390 can include a network connection to an external management system, and the management device can communicate with the management system to report status information for information handling system 300, to receive BIOS/UEFI or system firmware updates, or to perform other task for managing and controlling the operation of information handling system 300. Management device 390 can operate off of a separate power plane from the components of the host environment so that the management device receives power to manage information handling system 300 when the information handling system is otherwise shut down. An example of management device 390 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 390 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A display device, comprising:
    a display panel device including a first magnetic adherent; and
    a frame configured to hold the display panel device and including a second adherent, wherein the display panel device is adhered to the frame via the first adherent and the second adherent, such that the display panel device is removable from the frame for rework without damaging the first adherent and the second adherent; and wherein the first adherent includes a single-sided magnetic tape including an adhesive side and a magnetic side, the magnetic tape adhered by the adhesive side to the frame, wherein the second adherent includes a glue adhered to the display panel device, the glue formed around a perimeter of the display panel device and substantially collocated with the magnetic tape, the glue including material that is magnetically attracted to the magnetic side of the magnetic tape.

2. The display device of claim 1, wherein the magnetic tape is formed around a perimeter of the frame.

3. The display device of claim 1, wherein the glue includes one of a silicon adhesive and an epoxy adhesive.

4. The display device of claim 1, wherein the material is a magnetic material.

5. The display device of claim 1, wherein the material is a magnetizable material.

6. The display device of claim 5, wherein the magnetizable material includes one of iron, cobalt, and nickel.

7. The display device of claim 1, wherein the display panel device is magnetically adhered to the frame with an adhesion level of greater than 60 grams per square millimeter.

8. The display device of claim 1, wherein the display panel device is adhered to the frame with an adhesion level of less than 120 grams per square millimeter.

9. A method, comprising:
    providing a display panel device of a display device, the display panel device including a first magnetic adherent;
    providing a frame of the display device, the frame including a second magnetic adherent and configured to hold a display panel device of the display device; and magnetically adhering the display panel device to the frame via the first adherent and the second adherent, such that the display panel device is removable from the frame for rework without damaging the first adherent and the second adherent, wherein the first adherent includes a single-sided magnetic tape to the frame, the magnetic tape including an adhesive side and a magnetic side, the magnetic tape adhered by the adhesive side to the frame, wherein the second adherent includes a glue adhered to the display panel device, the glue formed around a perimeter of the display panel device and substantially collocated with the magnetic tape, the glue including material that is magnetically attracted to the magnetic side of the magnetic tape.

10. The method of claim 9 wherein the magnetic tape is formed around a perimeter of the frame.

11. The method of claim 9, wherein the glue includes one of a silicon adhesive and an epoxy adhesive.

12. The method of claim 9, wherein the material is a magnetic material.

13. The method of claim 9, wherein the material is a magnetizable material.

14. The method of claim 13, wherein the magnetizable material includes one of iron, cobalt, and nickel.

15. The method of claim 9, wherein the display panel device is magnetically adhered to the frame with an adhesion level of greater than 60 grams per square millimeter.

16. The method of claim 9, wherein the display panel device is adhered to the frame with an adhesion level of less than 120 grams per square millimeter.

17. A display device comprising:
a protective cover including a first magnetic adherent; and
a frame configured to hold the protective cover and including a second adherent, wherein the protective cover is adhered to the frame via the first adherent and the second adherent, such that the protective cover is removable from the frame for rework without damaging the first adherent and the second adherent, wherein the first adherent includes a single-sided magnetic tape including an adhesive side and a magnetic side, the magnetic tape adhered by the adhesive side to the frame, wherein the second adherent includes a glue adhered to the display panel device, the glue formed around a perimeter of the display panel device and substantially collocated with the magnetic tape, the glue including material that is magnetically attracted to the magnetic side of the magnetic tape.

* * * * *